(12) United States Patent
Lee

(10) Patent No.: US 10,308,129 B2
(45) Date of Patent: *Jun. 4, 2019

(54) REAL-TIME BATTERY ESTIMATION

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 208 days.

This patent is subject to a terminal disclaimer.

(21) Appl. No.: 15/170,301

(22) Filed: Jun. 1, 2016

(65) Prior Publication Data

US 2016/0272081 A1    Sep. 22, 2016

Related U.S. Application Data

(62) Division of application No. 14/334,346, filed on Jul. 17, 2014, now Pat. No. 9,381,823.

(51) Int. Cl.
*B60L 11/00* (2006.01)
*B60L 11/18* (2006.01)
(Continued)

(52) U.S. Cl.
CPC ........... *B60L 11/1861* (2013.01); *B60K 6/28* (2013.01); *B60K 6/40* (2013.01); *G01R 31/3648* (2013.01);
(Continued)

(58) Field of Classification Search
None
See application file for complete search history.

(56) References Cited

U.S. PATENT DOCUMENTS 7,333,902 B2   2/2008  Melichar
7,536,277 B2 * 5/2009  Pattipatti ............ G05B 23/0251
                                                      702/183
(Continued)

FOREIGN PATENT DOCUMENTS

CN      101147078 A     3/2008
CN      201910474 U     7/2011
(Continued)

OTHER PUBLICATIONS

Elashhab, et al., May 18-20, 2008, Dept. of ECE, Oakland Unversity, pp. 60-65, "PEM Fuel Cell System Identification and Model Order Reduction for H-Loop Shaping Controller Design."
(Continued)

*Primary Examiner* — Jonathan M Dager
(74) *Attorney, Agent, or Firm* — David B. Kelley; Brooks Kushman P.C.

(57) ABSTRACT

Vehicle systems and methods can include a traction battery and a controller to implement a state estimator configured to output battery state based on internal resistance of the traction battery and a system dynamics estimation of the traction battery using discrete battery measurements of voltage and internal resistance, and operate the traction battery according to output of the state estimator. For example, the controller can identify a system dynamics model of the traction battery using a battery input current profile and a battery output voltage profile measured within a predefined time period, transform the identified system dynamics model to a state-space model having a diagonal system matrix consisting of system Eigenvalues through the Eigendecomposition, estimate battery current limits and available power limits from the transformed system dynamics model, and operate the traction battery according to
(Continued)

system dynamics model identified using estimated battery current limits and available power limits.

20 Claims, 10 Drawing Sheets

(51) Int. Cl.
| | |
|---|---|
| *G01R 31/389* | (2019.01) |
| *G01R 31/36* | (2019.01) |
| *H01M 10/42* | (2006.01) |
| *B60K 6/28* | (2007.10) |
| *B60K 6/40* | (2007.10) |
| *H01M 10/48* | (2006.01) |
| *G01R 31/367* | (2019.01) |

(52) U.S. Cl.
CPC ...... *G01R 31/389* (2019.01); *H01M 10/4257* (2013.01); *H01M 10/48* (2013.01); *B60L 2260/44* (2013.01); *B60Y 2200/92* (2013.01); *G01R 31/367* (2019.01); *H01M 2010/4271* (2013.01); *H01M 2220/20* (2013.01); *Y02T 10/7005* (2013.01); *Y02T 10/705* (2013.01); *Y02T 10/7044* (2013.01); *Y10S 903/907* (2013.01)

(56) References Cited

U.S. PATENT DOCUMENTS

| | | | | |
|---|---|---|---|---|
| 7,800,375 | B2* | 9/2010 | Plett | G01R 31/3651 324/426 |
| 7,969,120 | B2* | 6/2011 | Plett | G01R 31/361 320/145 |
| 7,994,755 | B2* | 8/2011 | Plett | G01R 31/3624 320/132 |
| 8,539,408 | B1* | 9/2013 | Cheng | G06F 17/5036 716/110 |
| 8,560,257 | B2* | 10/2013 | Tang | G01R 31/3679 320/137 |
| 9,108,524 | B2* | 8/2015 | Zhang | B60L 11/1861 |
| 9,187,007 | B2 | 11/2015 | Li et al. | |
| 2009/0091299 | A1* | 4/2009 | Lin | H01M 10/441 320/137 |
| 2011/0234167 | A1 | 9/2011 | Kao et al. | |
| 2011/0309838 | A1* | 12/2011 | Lin | G01R 31/3624 324/427 |
| 2013/0013236 | A1* | 1/2013 | Takahashi | G01R 31/3651 702/63 |
| 2013/0090900 | A1* | 4/2013 | Gering | G01R 31/3679 703/2 |
| 2014/0203813 | A1* | 7/2014 | Driemeyer-Franco | G01R 31/3624 324/434 |
| 2014/0333317 | A1* | 11/2014 | Frost | G01R 31/3606 324/430 |
| 2014/0350877 | A1* | 11/2014 | Chow | G01R 31/3624 702/63 |
| 2014/0358459 | A1* | 12/2014 | Trnka | G01R 31/3651 702/63 |
| 2015/0066405 | A1* | 3/2015 | Li | B60L 11/1805 702/63 |
| 2015/0197164 | A1* | 7/2015 | Lee | B60L 11/1864 701/22 |
| 2015/0219726 | A1* | 8/2015 | Lenz | G01R 31/3606 702/63 |
| 2015/0231982 | A1* | 8/2015 | Li et al. | B60L 1/003 701/22 |
| 2015/0231985 | A1* | 8/2015 | Li | B60L 11/1862 320/134 |
| 2015/0231986 | A1* | 8/2015 | Li | B60L 11/123 701/22 |
| 2015/0232083 | A1* | 8/2015 | Yu | B60W 10/06 701/22 |
| 2015/0306971 | A1* | 10/2015 | Chang | B60L 11/1862 701/22 |
| 2015/0349385 | A1* | 12/2015 | Hu | G01R 31/3651 429/91 |
| 2015/0352972 | A1* | 12/2015 | Li | G01R 31/3648 701/22 |
| 2015/0355283 | A1* | 12/2015 | Lee | G01R 31/3606 702/63 |
| 2015/0362559 | A1* | 12/2015 | Hametner | G01R 31/3624 702/63 |
| 2015/0377974 | A1* | 12/2015 | Choi | G01R 31/3651 702/63 |
| 2016/0018471 | A1* | 1/2016 | Lee | G01R 31/3648 702/63 |
| 2016/0023567 | A1* | 1/2016 | Lee | B60L 11/1861 320/136 |
| 2016/0023568 | A1* | 1/2016 | Lee | B60L 11/1861 429/50 |
| 2016/0023569 | A1* | 1/2016 | Lee | B60L 11/1861 429/50 |
| 2016/0054390 | A1* | 2/2016 | Lin | B60L 11/1851 702/63 |
| 2017/0259686 | A1* | 9/2017 | Lee | B60L 11/1861 |

FOREIGN PATENT DOCUMENTS

| | | |
|---|---|---|
| CN | 102200568 A | 9/2011 |
| CN | 103625303 A | 3/2014 |
| JP | H0888941 A | 4/1996 |
| JP | H10232273 A | 9/1998 |

OTHER PUBLICATIONS

Hu, et al, Mar. 1, 2011, Center for Automotive Research, The Ohio State University, vol. 196; Issue 5, pp. 2913-2923, "Linear Parameter Varying Battery Model Identification using Subspace Methods."

Swarup, et al, Oct. 25-28, 2011, Dept. of Electr. Eng. University of California, pp. 91-94, "Battery State of Charge Estimation using Adaptive Subspace Identification Method."

* cited by examiner

REAL-TIME BATTERY ESTIMATION

This application is a division of U.S. patent application Ser. No. 14/334,346, filed on Jul. 17, 2014, the disclosure of which is hereby incorporated in its entirety by reference herein.

TECHNICAL FIELD

Various embodiments relate to an electric vehicle and a method for estimating the state of a battery, specifically, estimating in real-time, and using the battery estimation to control the vehicle systems in view of the battery state.

BACKGROUND

Hybrid electric vehicles (HEV) utilize a combination of an internal combustion engine with an electric motor to provide motive power. This arrangement provides improved fuel economy over a vehicle that has only an internal combustion engine. One method of improving the fuel economy in a HEV is to shutdown the engine during times that the engine operates inefficiently, and is not otherwise needed to propel the vehicle. In these situations, the electric motor is used to provide all of the power needed to propel the vehicle. When the driver power demand increases such that the electric motor can no longer provide enough power to meet the demand, or in other cases such as when the battery state of charge (SOC) drops below a certain level, the engine provides the motive power for the vehicle.

The HEV includes a battery management system that estimates values descriptive of the battery pack and/or battery cell present operating conditions. The battery pack and/or cell operating conditions include battery SOC, power fade, capacity fade, and instantaneous available power. The battery management system should be capable of estimating values during changing cell characteristics as cells age over the lifetime of the pack. The precise estimation of some values may improve performance and robustness, and may ultimately lengthen the useful lifetime of the battery pack.

SUMMARY

A vehicle can include a traction battery including a plurality of cells and at least one controller programmed to implement a state estimator. The state estimator can be configured to output battery state based on internal resistance of the traction battery and a system dynamics estimation of the traction battery using discrete battery measurements of voltage and internal resistance, and operate the traction battery according to output of the state estimator. In an example, the system dynamics estimation applies a subspace identification algorithm to approximate system matrices.

In an example, the controller uses the system matrices to derive a current limit expression. The controller can output battery current limits using estimated state variables and estimated internal resistance. In an example, the computed internal resistance is estimated using battery current input during a time period and the state variables being estimated from the terminal voltage during the time period.

In an example, the controller can estimate the internal resistance during a time period, identify a discrete state space model by a subspace identification algorithm using a battery current input profile and a battery terminal voltage profile collected within a predefined time period, convert the discrete model to continuous state space model, perform Eigendecomposition of the system matrix of the continuous model, transform the state space model by the Eigendecomposition, and derive analytic expressions for computing battery current limits within a predefined time period.

The controller can also determine whether additional battery model parameters need to be updated and if so repeat the process for the additional battery model parameters.

In an example, a vehicle can include a at least one controller programmed to identify a system dynamics model of the traction battery using a battery input current profile and a battery output voltage profile measured within a predefined time period, transform the identified system dynamics model to a state-space model having a diagonal system matrix consisting of system Eigenvalues through the Eigendecomposition, estimate battery current limits and available power limits from the transformed system dynamics model, and operate a traction battery according to system dynamics model identified using estimated battery current limits and available power limits.

In an example, the system dynamics model can include a system dynamics matrix, an input matrix and an output matrix. The system dynamics model can be identified using a subspace identification algorithm. In an example, the subspace identification algorithm uses a voltage profile manipulated by subtracting a voltage drop across a battery internal resistance from the battery output voltage profile. The computed internal resistance can be estimated using battery current input profile during the predetermined time period and the measured terminal voltage profile during the time period.

In the vehicle or controller, the system dynamics model is updated in real time.

Various methods can be performed with the vehicle and controller. In an example, a method for vehicle control includes identifying a system dynamics model of a traction battery using a battery input current profile and a battery output voltage profile measured within a predefined time period, transforming the identified system dynamics model to a state-space model having a diagonal system matrix consisting of system Eigenvalues through the Eigendecomposition, estimating battery current limits and available power limits from the transformed system dynamics model, and operating the traction battery according to system dynamics model identified using estimated battery current limits and available power limits.

In an example, the step of identifying the system dynamics model comprises identifying a system dynamics matrix, an input matrix and an output matrix.

In an example, the step of identifying the system dynamics model includes using a subspace identification algorithm In an example, the step of identifying the system dynamics model includes using a voltage profile manipulated by subtracting a voltage drop across a battery internal resistance from the battery output voltage profile.

In an example, the step of identifying the system dynamics model includes estimating the computed internal resistance using the battery current input profile during the predetermined time period and the measured terminal voltage profile during the time period.

In an example, the step of identifying the system dynamics model includes identifying the system dynamics model in real time.

DETAILED DESCRIPTION

Figure 1:
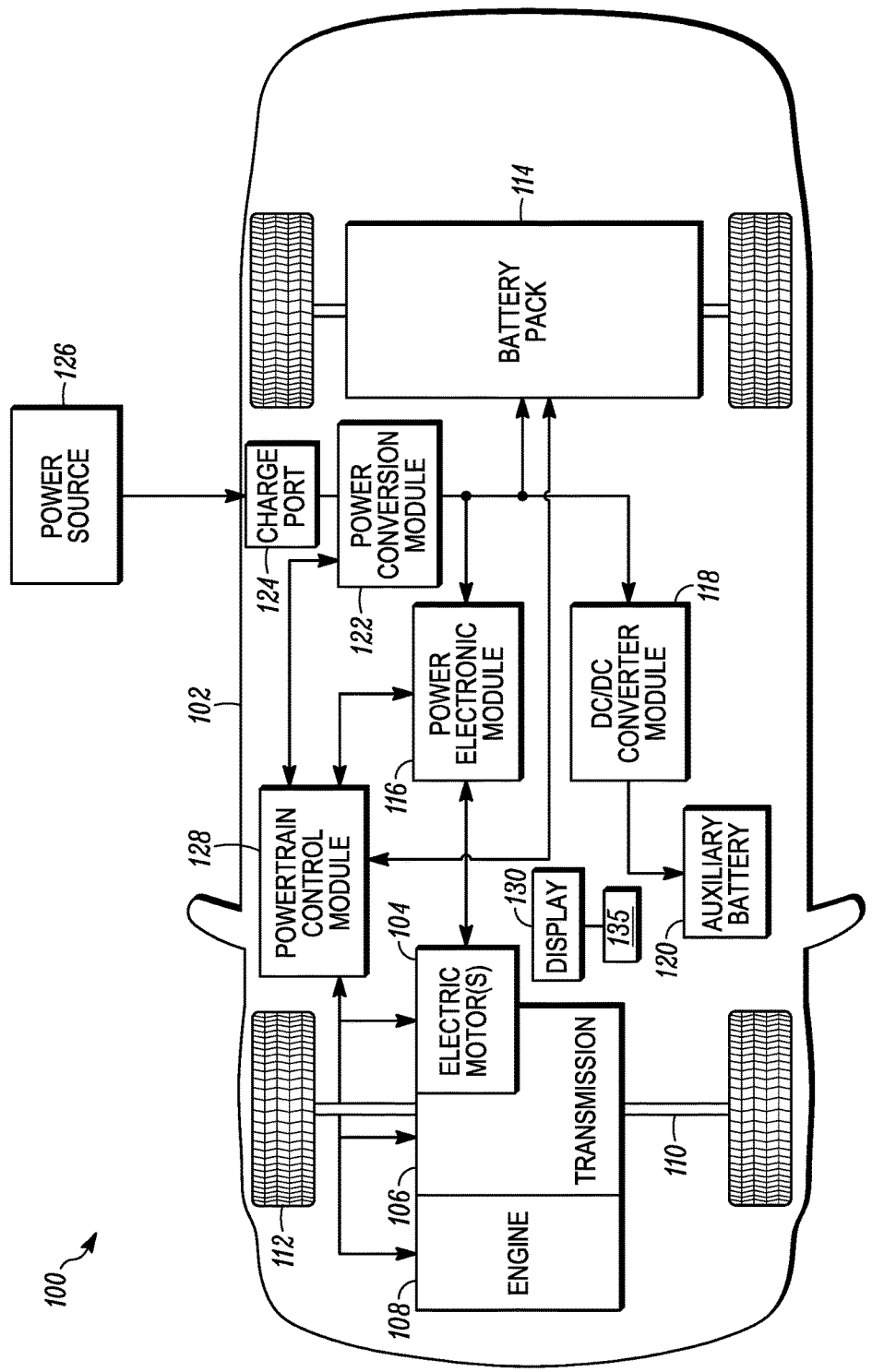
FIG. 1 is a hybrid electric vehicle that can be used with the described systems and methods.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

As an overview, the present disclosure describes systems and methods to determine parameters of a traction battery and to control a vehicle. At times direct measurement of the battery parameters cannot be performed. A battery system model is used to estimate the battery parameters. The present disclosure describes various systems and methods to construct a battery system model. Such a battery system model can be used to identify parameters of the battery in real-time. More specifically, examples of the present disclosure proposes an approach for identifying the battery system through subspace identification approaches combined with the separation of a pure dynamics part and a control throughput part to improve the identification accuracy and to reduce the identified system order. The obtained discrete state-space model is converted to the continuous state-space model, which can then be used to derive an expression for battery current limit computation. Factorization, e.g., spectral decomposition or Eigendecomposition, may then be used to process the continuous state-space model and to derive a general expression for battery current limit prediction.

An example includes using a subspace identification approach to construct the battery system model. The subspace identification method may provide some advantages, e.g., state vector x(k) and initial value x(0) can be found from the measured data, a linear system order can be determined, non-linear optimization is not required, and noise information is not required. An additional benefit is that subspace identification is less sensitive to the noise than other recursive identification approaches, such as the Extended Kalman Filter (EKF) techniques. Moreover, identification performance of the subspace identification is more robust than the EKF, since noise effects are inherently identified. In contrast, noise covariance matrices should be determined in the EKF to achieve the desired identification performance.

FIG. 1 depicts an example of a hybrid-electric vehicle 102, e.g., plug-in hybrid-electric vehicle. A plug-in hybrid-electric vehicle 102 may comprise one or more electric motors 104 mechanically connected to a hybrid transmission 106. In addition, the hybrid transmission 106 is mechanically connected to an engine 108. The hybrid transmission 106 may also be mechanically connected to a drive shaft 110 that is mechanically connected to the wheels 112. The electric motors 104 can provide torque to the wheels when the engine 108 is turned on. Electric motor 104 consumes electrical energy, e.g., from a battery 114, to provide torque to propel the vehicle 102. The electric motors 104 can provide deceleration capability when the engine 108 is turned off. The electric motors 104 may be configured as generators and can provide fuel economy benefits by recovering energy that would normally be lost as heat in the friction braking system. The electric motors 104 may also reduce pollutant emissions since the hybrid electric vehicle 102 may be operated in electric mode under certain conditions.

The traction battery or battery pack 114 stores energy that can be used by the electric motors 104. A vehicle battery pack 114 typically provides a high voltage DC output. The battery output is made in response to a battery power request, which can be calculated from the feedforward battery power value as a function of the driver power request and the engine power request, which in turn can be based on the speed and torque determinations. The battery pack 114 is electrically connected to a power electronics module 116. The power electronics module 116 is also electrically connected to the electric motors 104 and provides the ability to bi-directionally transfer energy between the battery pack 114 and the electric motors 104. For example, a typical battery pack 14 may provide a DC voltage while the electric motors 104 may require a three-phase AC current to function. The power electronics module 116 may convert the DC voltage to a three-phase AC current as required by the electric motors 104. In a regenerative mode, the power electronics module 116 will convert the three-phase AC current from the electric motors 104 acting as generators to the DC voltage required by the battery pack 114. The methods described herein are equally applicable to a pure electric vehicle or any other device using a battery pack. The battery 114 can experience degradation during certain uses of the vehicle. One use in which degradation occurs is storage at a high state of charge (SOC). Temperature can also be a factor in degradation Battery degradation is individualized for a specific type of battery. Battery degradation can include the inability of a battery 114 to hold a quantity of charge, e.g., less kW-hour or amp-hours are stored in the battery 114.

In addition to providing energy for propulsion, the battery 114 (or battery pack) may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V battery 120. An all-electric vehicle may have a similar architecture but without the engine 108.

The battery pack 114 may be recharged by an external power source 126. The battery charge storage status can be measured as state of charge. The external power source 126 may provide AC or DC power to the vehicle 102 by electrically connecting through a charge port 124. The charge port 124 may be any type of port configured to transfer power from the external power source 126 to the vehicle 102. The charge port 124 may be electrically connected to a power conversion module 122. The power conversion module may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric motors, battery, power conversion and power electronics may be controlled by a powertrain control module (PCM) 128.

In addition to illustrating a plug-in hybrid vehicle, FIG. 1 can illustrate a battery electric vehicle (BEV) if component 108 is removed. Likewise, FIG. 1 can illustrate a traditional hybrid electric vehicle (HEV) or a power-split hybrid electric vehicle if components 122, 124, and 126 are removed. FIG. 1 also illustrates the high voltage system which includes the electric motor(s), the power electronics module 116, the DC/DC converter module 118, the power conversion module 122, and the battery pack 114. The high voltage system and battery pack includes high voltage components including bus bars, connectors, high voltage wires, and circuit interrupt devices.

Vehicle 100 further includes a display 130 that can show data regarding the state of the vehicle, e.g., state of the electrical system and battery 114, as well as vehicle use/non-use data. A data generator 135 can be connected to the display to compute and organize the data for the display 130. In an example, the display 130 can show the battery state as estimated or determined as described herein.

Figure 2:
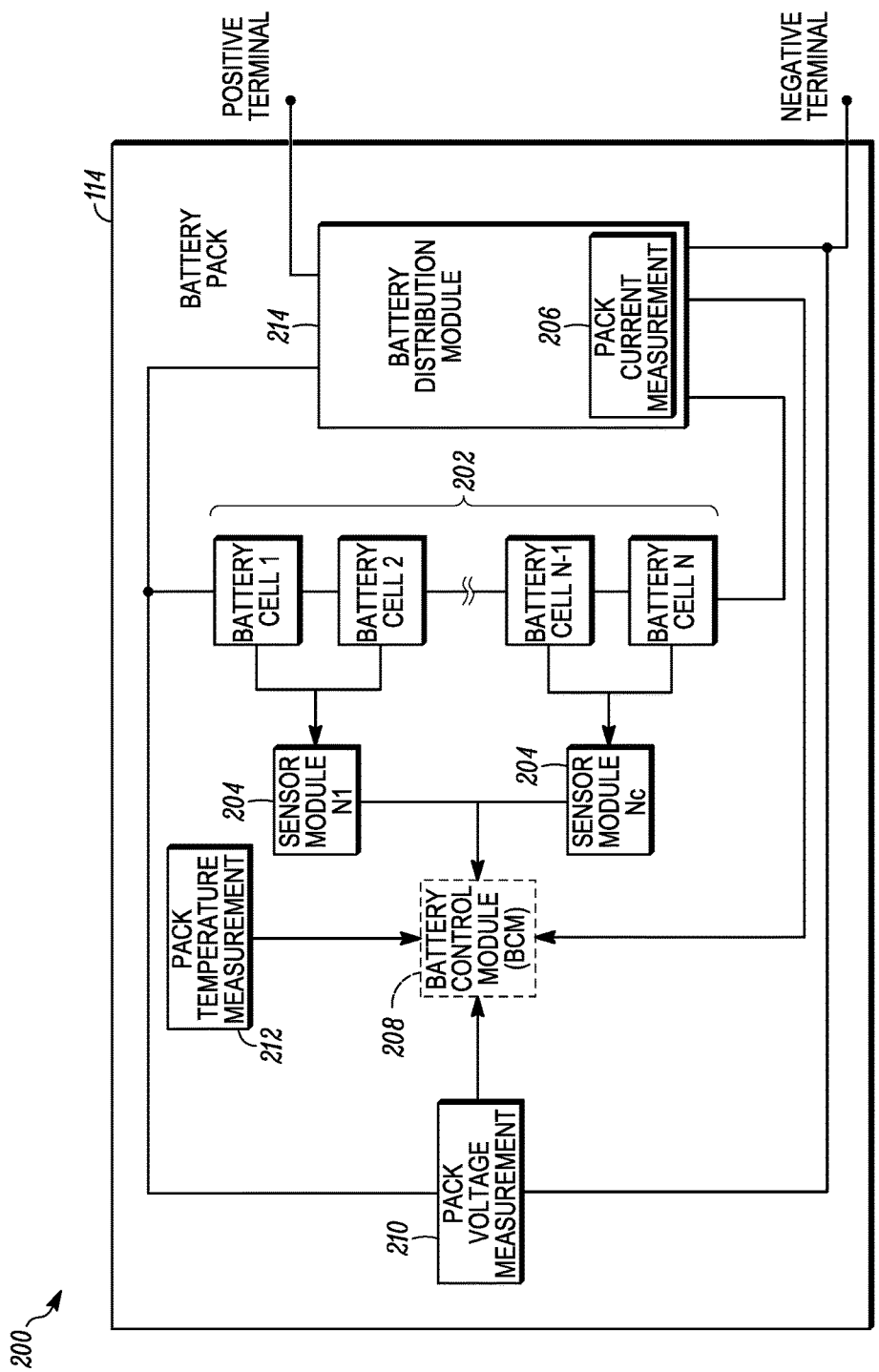
FIG. 2 is a detailed view of the battery for a hybrid electric vehicle.

The individual battery cells within a battery pack may be constructed from a variety of chemical formulations. Typical battery pack chemistries may include but are not limited to lead acid, nickel cadmium (NiCd), nickel-metal hydride (NIMH), Lithium-Ion or Lithium-Ion polymer. FIG. 2 shows a typical battery pack 200 in a simple series configuration of N battery cell modules 202. The battery cell modules 202 may contain a single battery cell or multiple battery cells electrically connected in parallel. The battery pack, however, may be composed of any number of individual battery cells and battery cell modules connected in series or parallel or some combination thereof. A typical system may have one or more controllers, such as a Battery Control Module (BCM) 208 that monitors and controls the performance of the battery pack 200. The BCM 208 may monitor several battery pack level characteristics such as pack current measured by a current sensor 206, pack voltage 210 and pack temperature 212. The performance of the current sensor 206 may be essential, in certain arrangements, to build a reliable battery monitoring system. The accuracy of the current sensor may be useful to estimate the battery state of charge and capacity. A current sensor may utilize a variety of methods based on physical principles to detect the current including a Hall effect IC sensor, a transformer or current clamp, a resistor in which the voltage is directly proportional to the current through it, fiber optics using an interferometer to measure the phase change in the light produced by a magnetic field, or a Rogowski coil. In the event a battery cell is charging or discharging such that the current entering or exiting the battery cell exceeds a threshold, the battery control module may disconnect the battery cell via the use of a circuit interrupt device (CID) such as a fuse or circuit breaker.

In addition to the pack level characteristics, there may be battery cell level characteristics that need to be measured and monitored. For example, the terminal voltage, current, and temperature of each cell may be measured. A system may use a sensor module 204 to measure the characteristics of one or more battery cell modules 202. The characteristics may include battery cell voltage, temperature, age, number of charge/discharge cycles, etc. Typically, a sensor module will measure battery cell voltage. Battery cell voltage may be voltage of a single battery or of a group of batteries electrically connected in parallel or in series. The battery pack 200 may utilize up to $N_c$ sensor modules 204 to measure the characteristics of all the battery cells 202. Each sensor module 204 may transfer the measurements to the BCM 208 for further processing and coordination. The sensor module 204 may transfer signals in analog or digital form to the BCM 208. The battery pack 200 may also contain a battery distribution module (BDM) 214 which controls the flow of current into and out of the battery pack 200.

Figure 3:
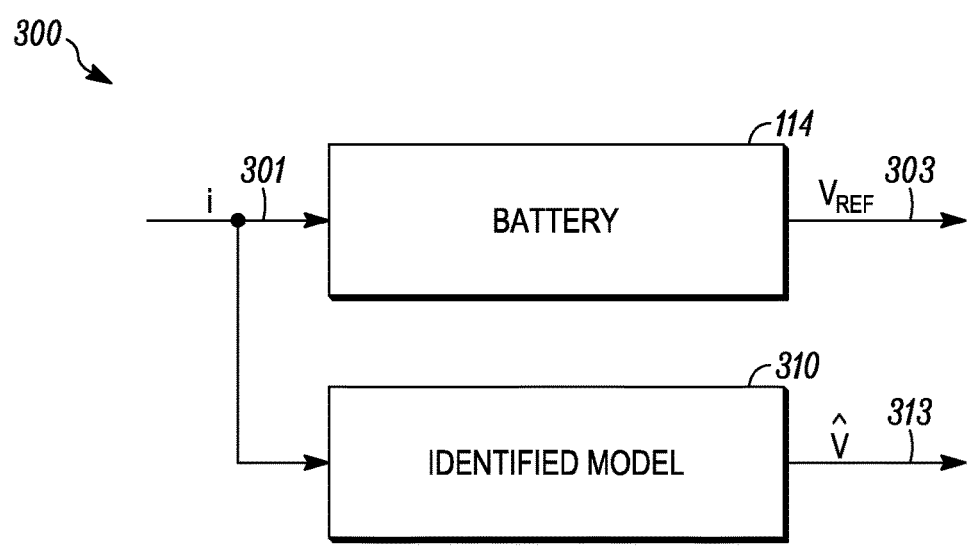
FIG. 3 is a schematic of a system controller.

FIG. 3 shows a schematic 300 of parameter estimation. A current i 301 is supplied to the battery which results in a reference voltage $v_{ref}$ 303. The reference voltage $v_{ref}$ 303 is the actual reference voltage at the battery. The current 301 is also supplied into the identified model of battery 310, which can be identified using the methods described herein, to output an estimated voltage $\hat{v}$ 313. The estimated voltage 313 can be used in control schemes for the vehicle as it represents the estimated value at a certain condition of the vehicle. The identified model 310 can be stored in memory onboard the vehicle and be used in computations, e.g., in a module or processor, to estimate the state of the battery 114. For example, the model 310 can determine estimated battery current limits and available power limits.

Figure 4:
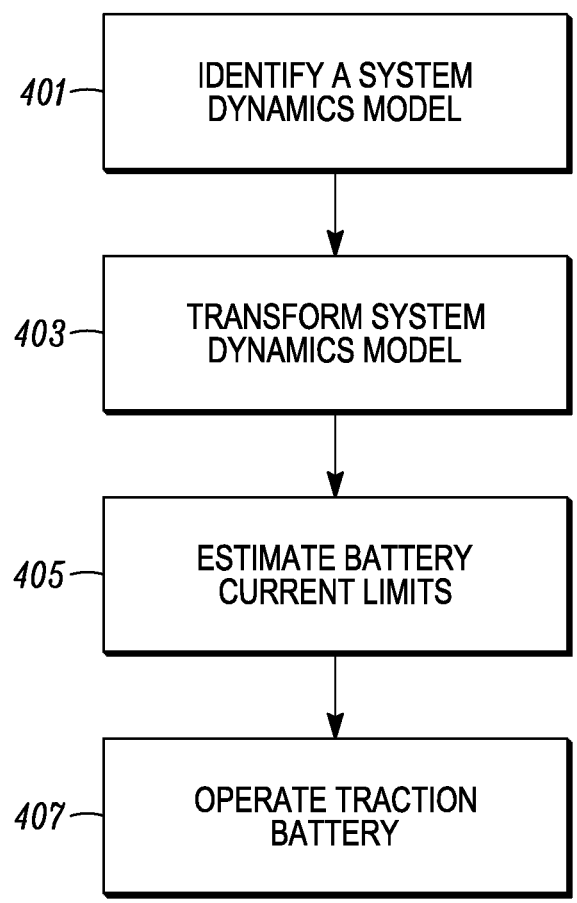
FIG. 4 is a flow chart of a method according to various examples.

FIG. 4 shows a method flow 400 of an embodiment for battery parameter estimation. At 401, a system dynamics model of a traction battery is identified using a battery input current profile and a battery output voltage profile measured within a time period. The time period can be set to a small value, e.g., 100 microseconds or a multiple of 100 microseconds. The time period can also be set to a time when the battery is not supplying current to move the vehicle or not move or power the vehicle. The time period can also be set to when the battery is not being charged. At 403, the identified system dynamics model is transformed to a state-space model appropriate to derive explicit expressions for battery current limit prediction. In an example, the state space model has a diagonal system matrix consisting essentially of system Eigenvalues through the Eigendecomposition. At 405, the system can estimate battery current limits and available power limits using the transformed system dynamics model. At 407, the vehicle controller(s) can operate the traction battery according to system dynamics model identified using estimated battery current limits and available power limits.

Figure 5:
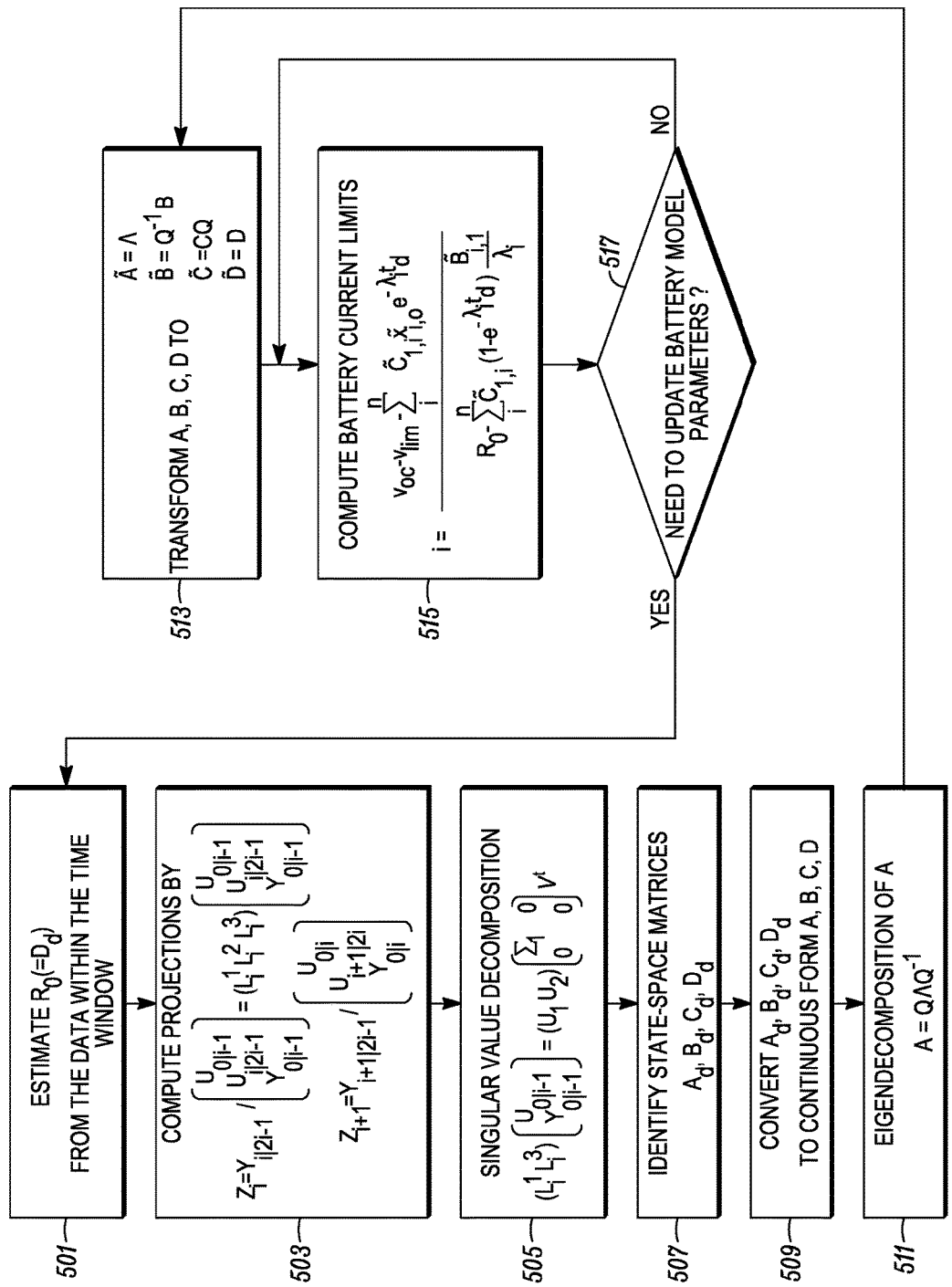
FIG. 5 is a flow chart of a method according to various examples.

FIG. 5 shows a method flow 500 of an embodiment for battery parameter estimation. At 501, the internal resistance of the battery $R_o$ is estimated. $R_o$ can be estimated from the N data obtained during the previous time window. The previous time window can be set to a time period during which the battery parameters need not be updated and can be based on prior test data of the vehicle or based on vehicle use history. In an example, the estimation of $R_o$ can be $$H_0 = \hat{R}_0 = D = \begin{cases} \frac{1}{N}\sum_{k=1}^{N}(v_k - v_{k-1})/(i_k - i_{k-1}), & i_k \neq i_{k-1} \\ 0, & i_k = i_{k-1} \end{cases} \quad (1)$$

where $v = v_t - v_{oc}$, with $v_t$ being the battery terminal voltage and $v_{oc}$ being the open circuit voltage. The battery system output can then be represented by $y = v_t - v_{oc} - \hat{R}_0 i$, the state space model is expressed as $$x(k+1) = A_d x(k) B_d u(k) \quad (2)$$

$$y(k) = C_d x(k) \quad (3)$$

At 503, a numerical algorithm for subspace state space system identification (N4SID) can then be applied. Other subspace identification algorithms may be used, and an N4SID is used for exemplify a subspace identification algorithm. An N4SID can estimate an $n_x$ order state-space model using measured input-output data. Example equations for this algorithm as applied to the present battery state determination are $$Z_i = Y_{i|2i-1} / \begin{pmatrix} U_{0|i-1} \\ U_{i|2i-1} \\ Y_{0|i-1} \end{pmatrix} = (L_i^1 \ L_i^2 \ L_i^3) \begin{pmatrix} U_{0|i-1} \\ U_{i|2i-1} \\ Y_{0|i-1} \end{pmatrix} \quad (4)$$

$$Z_{i+1} = Y_{i+1|2i-1} / \begin{pmatrix} U_{0|i} \\ U_{i+1|2i} \\ Y_{0|i} \end{pmatrix} \quad (5)$$

where $A/B = AB^t(BB^t)^{-1}B$. (6)

where $L_i^1$, $L_i^2$, and $L_i^2$ are i-by-j matrices computed using equation (6).

$$\text{where } U_{0|i-1} = \begin{bmatrix} u_0 & u_1 & u_2 & \Lambda & u_{j-1} \\ u_1 & u_2 & u_3 & \Lambda & u_j \\ M & M & M & O & M \\ u_{i-1} & u_i & u_{i+1} & \Lambda & u_{i+j-2} \end{bmatrix} \quad (7a)$$

$$U_{i|2i-1} = \begin{bmatrix} u_i & u_{i+1} & u_{i+2} & \Lambda & u_{i+j-1} \\ u_{i+1} & u_{i+2} & u_{i+3} & \Lambda & u_{i+j} \\ M & M & M & O & M \\ u_{2i-1} & u_{2i} & u_{2i+1} & \Lambda & u_{2i+j-2} \end{bmatrix} \quad (7b)$$

$$Y_{0|i-1} = \begin{bmatrix} y_0 & y_1 & y_2 & \Lambda & y_{j-1} \\ y_1 & y_2 & y_3 & \Lambda & y_j \\ M & M & M & O & M \\ y_{i-1} & y_i & y_{i+1} & \Lambda & y_{i+j-2} \end{bmatrix} \quad (8a)$$

$$Y_{i|2i-1} = \begin{bmatrix} y_i & y_{i+1} & y_{i+2} & \Lambda & y_{i+j-1} \\ y_{i+1} & y_{i+2} & y_{i+3} & \Lambda & y_{i+j} \\ M & M & M & O & M \\ y_{2i-1} & y_{2i} & y_{2i+1} & \Lambda & y_{2i+j-2} \end{bmatrix} \quad (8b)$$

The row space of A/B is equal to the projection of the row space of A onto the row space of B.

At 505, a singular value decomposition may be conducted, but not limited to, by the following procedure.

Singular value decomposition is conducted as $$(L_i^1 \ L_i^3)\begin{pmatrix} U_{0|i-1} \\ Y_{0|i-1} \end{pmatrix} = (U_1 \ U_2)\begin{pmatrix} \Sigma_1 & 0 \\ 0 & 0 \end{pmatrix}V^t \quad (9)$$

where $\Gamma_i = U_1\Sigma_1^{1/2}$, and $\Gamma_{i-1} = U_1 \cdot \Sigma_1^{1/2}$.

System matrices are computed from $$\begin{pmatrix} \Gamma_{i-1}^* Z_{i+1} \\ Y_{i|1} \end{pmatrix} = \begin{pmatrix} K_{11} & K_{12} \\ K_{21} & K_{22} \end{pmatrix} \cdot \begin{pmatrix} \Gamma_i^* Z_i \\ U_{i|2i-1} \end{pmatrix} + \begin{pmatrix} \rho_1 \\ \rho_2 \end{pmatrix} \quad (10)$$

Matrices of the identified discrete state space model are determined as $A_d = K_{11}$, $B_d = K_{21}$ and $C_d$, $D_d$ are from $K_{12}$ and $K_{22}$, respectively.

In another example, the matrices can be determined via a different N4SID algorithm, e.g., an approximation solution. Firstly the states $\tilde{X}_i$ and $\tilde{X}_{i+1}$ are determines, e.g., using the following equations:

$$\tilde{X}_i = \Gamma_i^*(\Gamma_i^1 \ \Gamma_i^3)\begin{pmatrix} U_{0|i-1} \\ Y_{0|i-1} \end{pmatrix} \quad (11a)$$

$$\tilde{X}_{i+1} = \Gamma_{i+1}^*(\Gamma_{i+1}^1 \ \Gamma_{i+1}^3)\begin{pmatrix} U_{0|i} \\ Y_{0|i} \end{pmatrix} \quad (11b)$$

Then the least squares solution is applied $$\begin{pmatrix} \tilde{X}_{i+1} \\ Y_{i|i} \end{pmatrix} = \begin{pmatrix} \tilde{L}_{11} & \tilde{L}_{12} \\ \tilde{L}_{21} & \tilde{L}_{22} \end{pmatrix} \cdot \begin{pmatrix} \tilde{X}_i \\ U_{i|i} \end{pmatrix} + \begin{pmatrix} \rho_1 \\ \rho_2 \end{pmatrix} \quad (12)$$

At 507, the matrices can be approximated as follows:

$$\begin{pmatrix} A_d & B_d \\ C_d & D_d \end{pmatrix} = \begin{pmatrix} \tilde{L}_{11} & \tilde{L}_{12} \\ \tilde{L}_{21} & \tilde{L}_{22} \end{pmatrix} \quad (13)$$

Thus, the state-space matrices $A_d$, $B_d$, $C_d$, and $D_d$ are now identified. From these the expression of the current limit from the battery can be identified.

At 509, the discrete state-space matrices are converted to continuous matrices.

From the continuous state-space expression $$\dot{x} = Ax + Bu$$

$$y = Cx + Du' \quad (14)$$

the discrete model is expressed as $$x_{k+1} = (I + A\Delta t)x_k + B\Delta t u_k \quad (15)$$

$$= A_d x_k + B_d u_k$$

$$y_k = C x_k + D u_k$$

$$= C_d x_k + D_d u_k$$

From the identified $A_d$, $B_d$, $C_d$, and $D_d$, a continuous state-space model is derived as $$A = (A_d - I)/\Delta t, \; B = B_d/\Delta t, \; C = C_d, \text{ and } D = D_d.$$

Once converted to continuous form, Eigendecomposition is performed, at 511. The equation for Eigendecomposition can be $$A = Q\Lambda Q^{-1}, \quad (16)$$

where Q is the n×n matrix whose i-th column is the basis Eigen vector $q_i$. $\Lambda$ is the diagonal matrix whose diagonal elements are corresponding Eigenvalues.

The transformed state vector expressed by the Eigenvectors is computed by $\tilde{x} = Q^{-1}x$.

At 513, the transformed state-space matrices are determined by $$\tilde{A} = A \quad (17a)$$

$$\tilde{B} = Q^{-1}B \quad (17b)$$

$$\tilde{C} = CQ \quad (17c)$$

$$\tilde{D} = D \quad (17d)$$

$$\text{where } \Lambda = \begin{bmatrix} \lambda_1 & 0 & \Lambda & & 0 \\ 0 & O & O & & \\ M & O & \lambda_i & & M \\ & & & O & 0 \\ 0 & & \Lambda & 0 & \lambda_n \end{bmatrix} \quad (18)$$

Now that the transformed state-space matrices are set, the battery model is identified, e.g., at 515. This can be done with the following equations $$\dot{\tilde{x}}_i = -\lambda_i \tilde{x}_i + \tilde{B}_{i,1} u \quad (19a)$$

$$y = \sum_i \tilde{C}_{1,i} \tilde{x}_i + \tilde{D}u \quad (19b)$$

where $y = v_{oc} - v_t = v_1 + v_2$ and $u = i$.

As a result and at 515, the battery current limits during the time duration $t = t_d$ can be computed by $$i = \frac{v_{OC} - v_{lim} - \sum_i^n \tilde{C}_{1,i}\tilde{x}_{i,0} e^{-\lambda_i t_d}}{R_0 - \sum_i^n \tilde{C}_{1,i}(1 - e^{-\lambda_i t_d})\frac{\tilde{B}_{i,1}}{\lambda_i}} \quad (20)$$

where $v_{lim}$, is the battery voltage limit. $v_{lim} = v_{lb}$ (battery lower voltage limit) for discharging, and $v_{lim} = v_{ub}$ (battery upper voltage limit) for charging.

When n=2, the equation is expressed as $$i = \frac{v_{OC} - v_{lim} - \tilde{C}_{1,1}\tilde{x}_{1,0} e^{-\lambda_1 t_d} - \tilde{C}_{1,2}\tilde{x}_{2,0} e^{-\lambda_2 t_d}}{R_0 - \tilde{C}_{1,1}(1 - e^{-\lambda_1 t_d})\frac{\tilde{B}_{1,1}}{\lambda_1} - \tilde{C}_{2,1}(1 - e^{-\lambda_2 t_d})\frac{\tilde{B}_{2,1}}{\lambda_2}} \quad (21)$$

The power limit can be calculated by the following for the charge state and the discharge state of the battery:

$$P_{lim} = |i_{min}| v_{ub}$$

$$P_{lim} = |i_{max}| v_{lb},$$

where $P_{lim}$ is the power capability, $v_{ub}$ is the battery upper voltage limit, and $i_{min}$ is the absolute minimum current. In the discharge state, $i_{max}$ is the maximum current that can be drawn from the battery. Thus the system may calculate the battery instantaneous power capabilities during a charge event or discharge event.

At 517, the decision whether the battery model parameters need to be updated is made. This can be decision can be triggered based on time since the last update. In another example, the vehicle condition or use can be used to trigger the update.

Figure 6A:
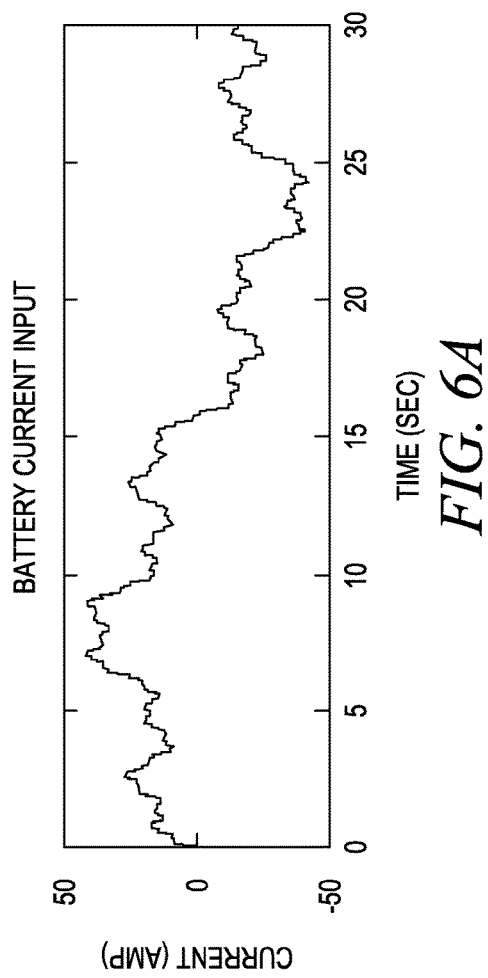
FIGS. 6A-6D are various graphs of vehicle parameters, actual and estimated according to an example.

FIG. 6A shows a graph of battery current input into the battery as a function of time with amps on the y-axis and time on the x-axis.

Figure 6B:
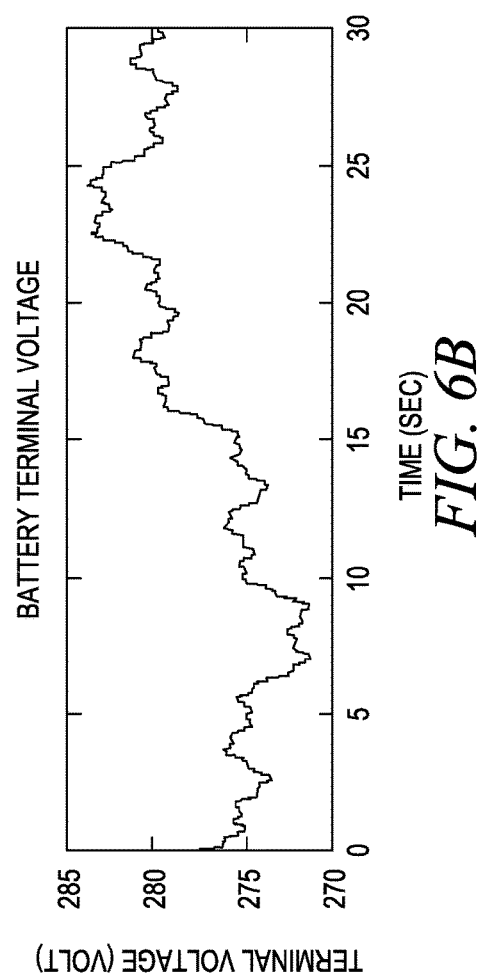

FIG. 6B show graph of battery terminal voltage at the battery as a function of time with volts on the y-axis and time on the x-axis.

Figure 6C:
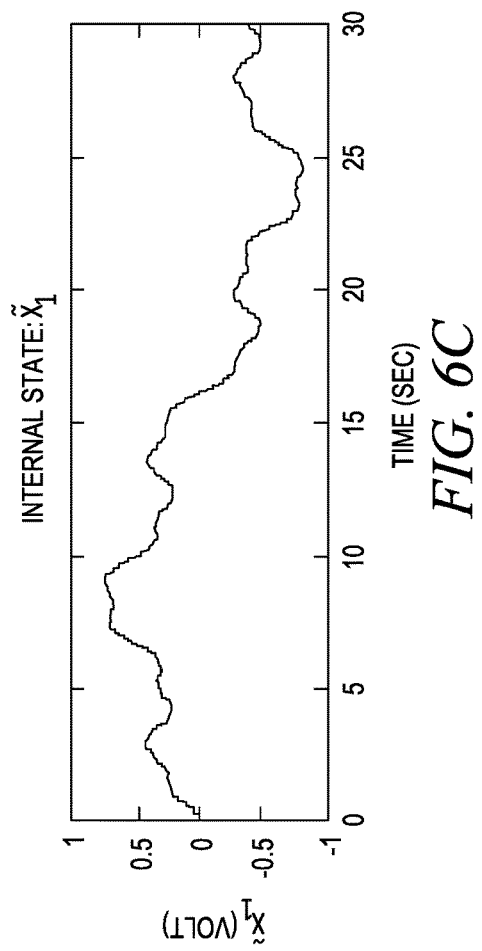

FIG. 6C shows a graph of estimated internal battery state $\tilde{x}_1$ in the battery as a function of time with volts on the y-axis and time on the x-axis.

Figure 6D:
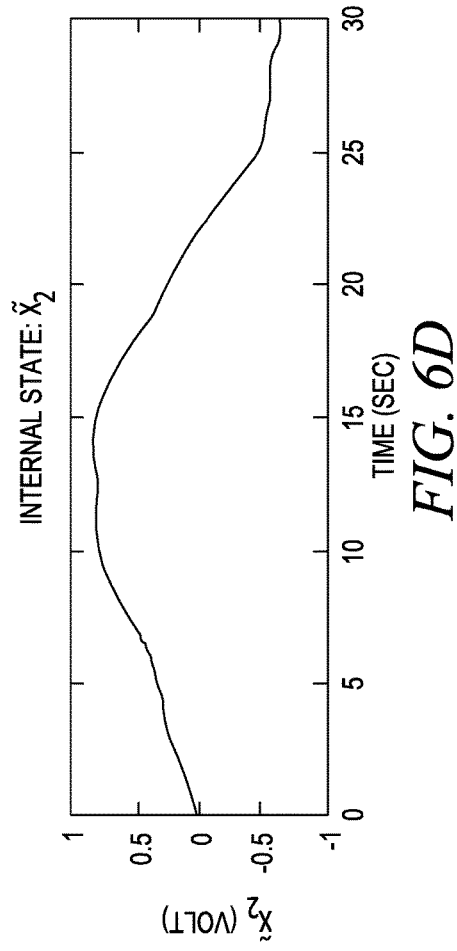

FIG. 6D show graph of estimated internal battery state $\tilde{x}_2$ in the battery as a function of time with volts on the y-axis and time on the x-axis.

Figure 7A:
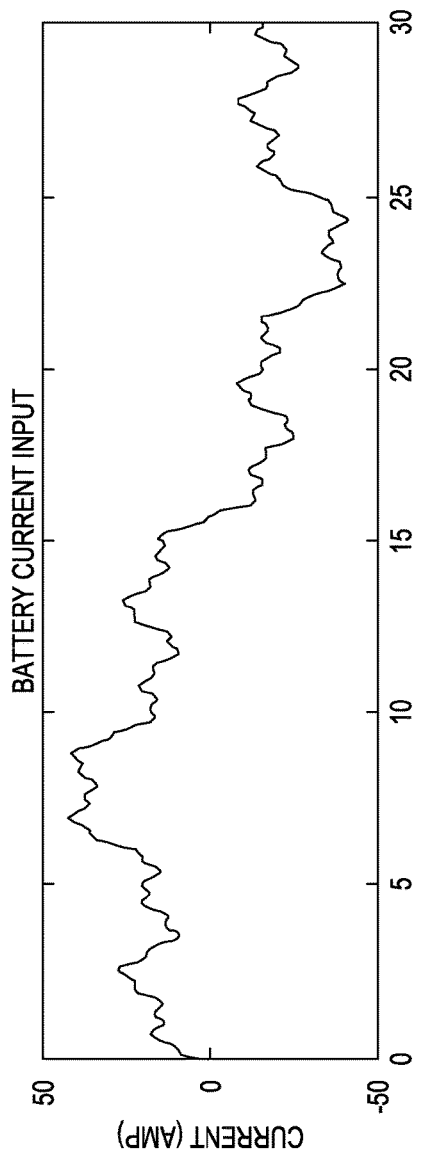
FIGS. 7A-7B are various graphs of vehicle parameters, actual and estimated according to an example.

FIG. 7A shows a graph of battery input current as a function of time.

Figure 7B:
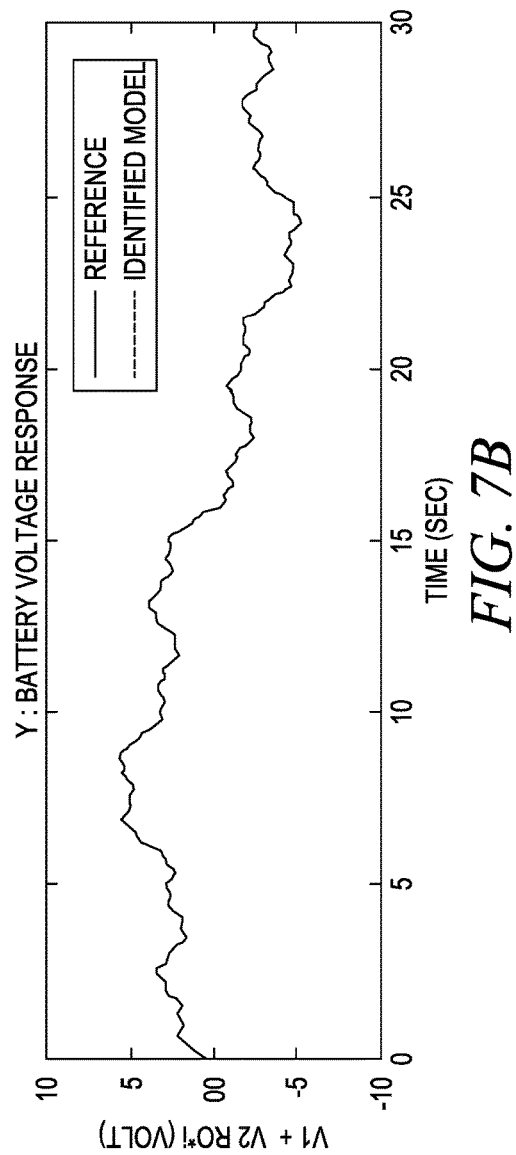

FIG. 7B shows a graph of battery voltage, as both $v_{ref}$ and a model voltage v_ref=v_t−v_oc−R_0*i. The label of y axis in FIG. 7B is v_t−v_oc−R_0*i._ as a function of time. As shown the model voltage, shown in dashed line, closely follows the reference voltage $v_{ref}$. For example, the Y scale is not large enough to show the identified battery model to be different than the reference signal.

Figure 8A:
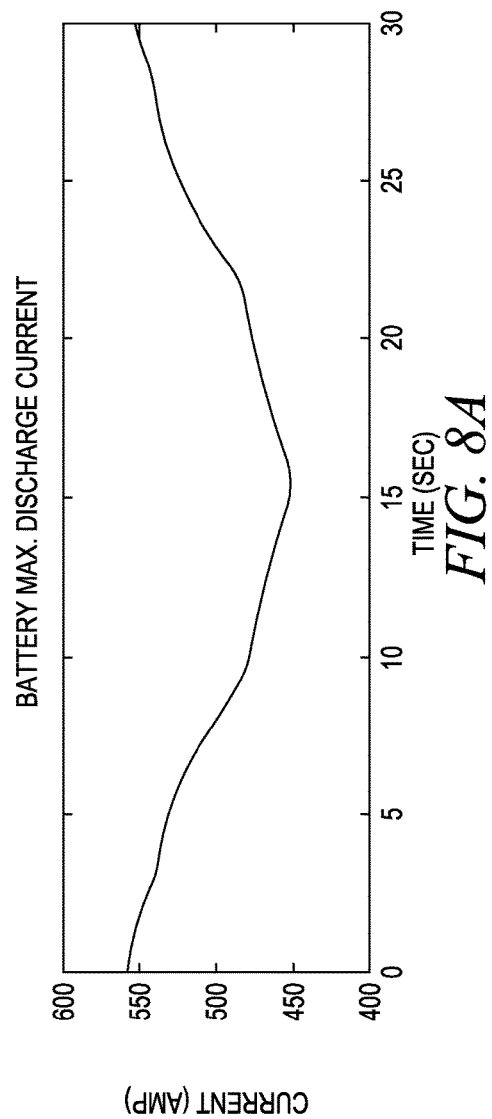
FIGS. 8A-8B are various graphs of vehicle parameters, actual and estimated according to an example.

FIG. 8A shows a graph of the calculated battery maximum discharge current as a function of time. This calculation is performed using the structures and methods described herein. This graph and its underlying data can be used to control operation of a vehicle, e.g., an HEV 102.

Figure 8B:
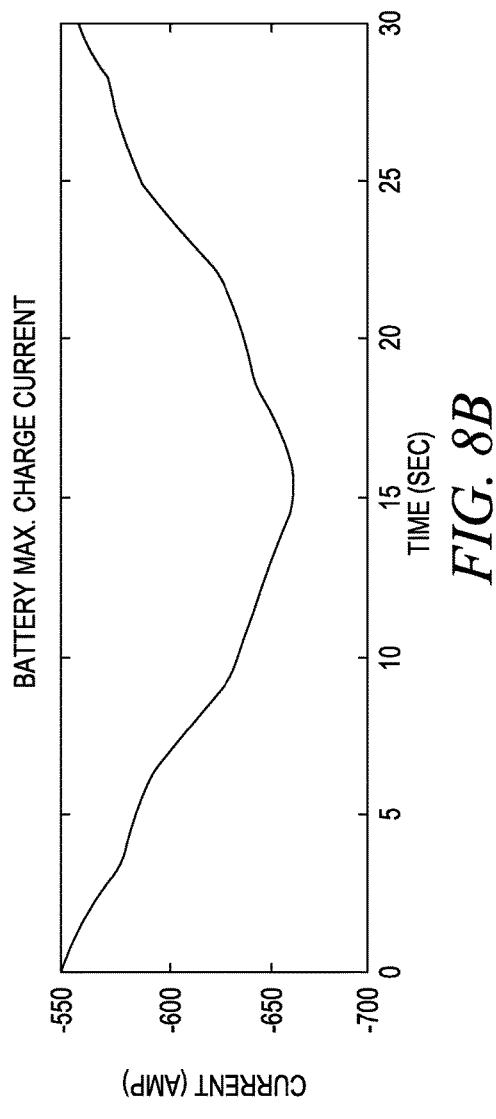

FIG. 8B shows a graph of the calculated battery maximum charge current as a function of time. This calculation is performed using the structures and methods described herein. This graph and its underlying data can be used to control operation of a vehicle, e.g., an HEV 102.

Figure 9:
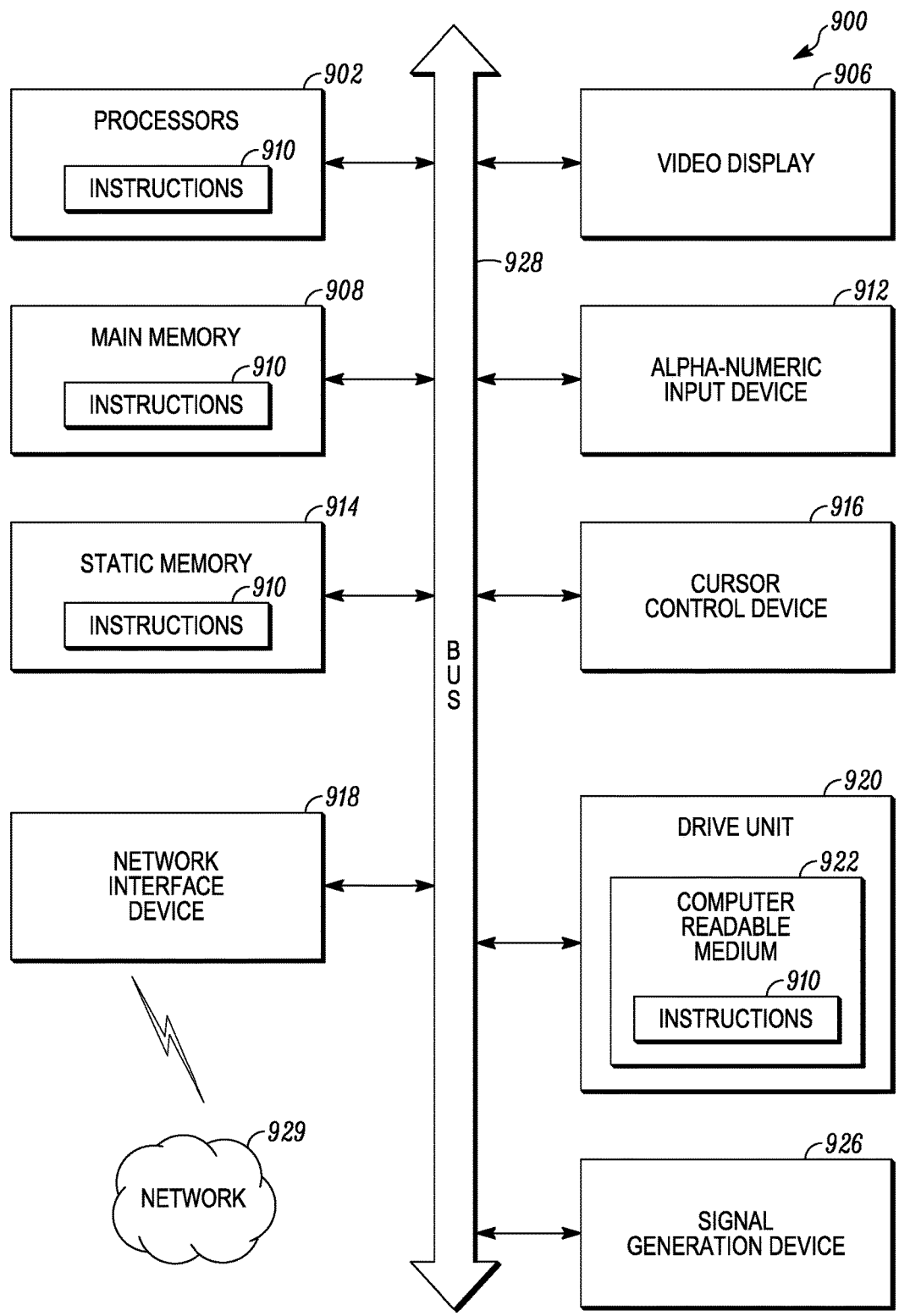
FIG. 9 shows a schematic view of a computing device for a vehicle.

FIG. 9 shows a diagrammatic representation of machine in the example form of a computer system 900 within which a set of instructions may be executed causing the machine to perform any one or more of the methods, processes, operations, or methodologies discussed herein. The HEV 102 can operate on one or more computer systems 900. The HEV 102 can include the functionality of one or more computer systems 900 or parts of the computer system 900.

In an example embodiment, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be similar to or includes components of a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 900 includes at least one processor 902 (e.g., a central processing unit (CPU) a graphics processing unit (GPU), auxiliary processors or combinations thereof), a main memory 908 and a static memory 914, which communicate with each other via a bus 928. The computer system 900 may further include a video display 906 (e.g., a liquid crystal display (LCD), light emitting diode (LED) or a cathode ray tube (CRT)). The display 906 can be on the vehicle driver instrument panel or otherwise mounted in the vehicle. The computer system 900 also includes an alphanumeric input device 912 (e.g., a keyboard or touchpad presenting a keyboard), a cursor control device 916 (e.g., a mouse, touch screen, joystick, track pad or the like), a drive unit 920, a signal generation device 926 (e.g., a speaker, horn or tone generator) and a network interface device 918.

The drive unit 920 includes a machine-readable medium 922 on which is stored one or more sets of instructions 910 (e.g., software) embodying any one or more of the methodologies or functions described herein. The instructions 910 may also reside, completely or at least partially, within the main memory 904 and/or within the processor 902 during execution thereof by the computer system 900. The main memory 908 and the processor 902 also constituting machine-readable media.

The software, e.g., instructions 910, may further be transmitted or received over a network 924 via the network interface device 918 via communication protocols that can code and decode data for transmission. The software instructions 910 can also be communicated over the bus 928.

While the machine-readable medium, e.g., element 922, is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the embodiments of the present invention. Such media can include tangible media. The term "machine-readable medium" shall accordingly be taken to include, but not be limited to, buses, tangible carrier wave signals, solid-state memories, and optical and magnetic media In electrified vehicle applications, power capability prediction in real-time is important for preventing battery damage and failure modes caused by overcharging and over-discharging. A battery can be modeled to allow battery management system, e.g., the vehicle processors, circuitry, modules or controller, to reduce the likelihood of damage or failure. A battery management system in electrified vehicle applications, such as Electric Vehicle (EV), Plug-in Hybrid Electric Vehicle (PHEV), and Full Hybrid Electric Vehicle (FHEV) may use battery model identification. However, the battery model identification needs not to be continuously executed, since the model parameter change is not so fast continuously. Thus, if the battery model identification can be executed on demand. However, the identification process should be done within a short period and in real-time once started, so that simpler and more efficient computational schemes can be used as the process is carried out on the vehicle. The present disclosure describes an approach for identifying the battery system through subspace identification approaches.

The battery model identification as described herein uses using state space identification (SSID). However, if the battery voltage data are directly used for the SSID, the order of the identified system tends to be higher to reproduce the original battery response. As described herein the battery system dynamics can be expressed without throughput of the current. Battery system can be modeled including an internal resistance $R_0$, which is typically represented as D matrix that is not used in SSID. By extracting this from the system response for SSID, it is believed that the system model can be identified with a simpler from and improved accuracy. As a result, the identification problem is separated into two parts: $R_0$ estimation and system dynamics estimation.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A vehicle comprising:
 a traction battery including a plurality of cells; and
 at least one controller programmed to implement a state estimator configured to output battery state based on internal resistance of the traction battery and a system dynamics estimation of the traction battery that uses discrete battery measurements of voltage and internal resistance, and operate the traction battery according to output of the state estimator.

2. The vehicle of claim 1, wherein the system dynamics estimation applies a subspace identification algorithm to approximate system matrices.

3. The vehicle of claim 2, wherein the controller uses the system matrices to derive expressions to estimate current limits from system matrices transformed using Eigendecomposition from the approximated system matrices from the subspace identification algorithm.

4. The vehicle of claim 2, wherein the controller outputs a battery current limit using estimated battery state variables and computed internal resistance.

5. The vehicle of claim 1, wherein the internal resistance is estimated using battery current input during a time period and a computed voltage that is estimated from battery terminal voltage during the time period.

6. The vehicle of claim 1, wherein the time period is 100 microseconds.

7. The vehicle of claim 1 wherein the controller is further programmed to:
estimate the internal resistance during a time period;
compute projections using a subspace identification algorithm;
decompose singular values of the computed projections;
identify a discrete state space model from the singular values;
convert the discrete state space model to a continuous state space model;
perform Eigendecomposition of a system matrix of the continuous state space model to a Eigendecomposed matrix;
transform a battery model with the Eigendecomposed matrix to produce transformed matrices; and
compute battery current limits based on the transformed matrices.

8. A vehicle comprising:
a traction battery including a plurality of cells; and
at least one controller programmed to implement a state estimator, which is based on an Eigendecomposed system dynamics model of the traction battery, configured to output battery state based on internal resistance of the traction battery and a system dynamics estimation of the traction battery that uses discrete battery measurements of voltage and internal resistance for the plurality of cells, and operate the traction battery according to output of the state estimator.

9. The vehicle of claim 8, wherein the system dynamics model comprises a system dynamics matrix, an input matrix and an output matrix.

10. The vehicle of claim 9, wherein the system dynamics model is updated in real time.

11. The vehicle of claim 8, wherein the system dynamics model is identified using a subspace identification algorithm.

12. The vehicle of claim 11, wherein the subspace identification algorithm uses a voltage profile manipulated by subtracting a voltage drop across a battery internal resistance from the battery output voltage profile.

13. The vehicle of claim 12, wherein a computed internal resistance is estimated using the battery input current profile during a time period and measured battery output voltage profile during the time period.

14. A vehicle comprising:
a traction battery including a plurality of cells; and
at least one controller configured to implement a state estimator configured to output battery state based on internal resistance of the traction battery and a system dynamics estimation of the traction battery that uses discrete battery measurements of voltage and internal resistance of a group of the plurality of cells, and operate the traction battery according to output of the state estimator.

15. The vehicle of claim 14, wherein the at least one controller is configured to estimate battery current and available power limits from a state-space model derived by Eigendecomposing a system dynamics model of the traction battery having a diagonal system matrix of system Eigenvalues and identified via a battery input current profile and a battery output voltage profile measured within a predefined time period.

16. The vehicle of claim 15, wherein the at least one controller is configured to identify the system dynamics model includes using a voltage profile manipulated by subtracting a voltage drop across a battery internal resistance from the battery output voltage profile.

17. The vehicle of claim 16, wherein the at least one controller is configured to identify the system dynamics model includes estimating the internal resistance using the battery current input profile during a time period and measured terminal voltage profile during the time period.

18. The vehicle of claim 15, wherein the at least one controller is configured to identify the system dynamics model includes identifying the system dynamics model in real time.

19. The vehicle of claim 14, wherein the system dynamics estimation applies a subspace identification algorithm to approximate system matrices; and wherein the at least one controller is configured to use the system matrices to derive expressions to estimate current limits from system matrices transformed using Eigendecomposition from the approximated system matrices from the subspace identification algorithm.

20. The vehicle of claim 18, wherein the at least one controller is configured to output a battery current limit using estimated battery state variables and computed internal resistance.

* * * * *